(12) United States Patent
Trusov et al.

(10) Patent No.: US 9,139,417 B2
(45) Date of Patent: Sep. 22, 2015

(54) MICROFABRICATION OF HIGH QUALITY THREE DIMENSIONAL STRUCTURES USING WAFER-LEVEL GLASSBLOWING OF FUSED QUARTZ AND ULTRA LOW EXPANSION GLASSES

(71) Applicant: The Regents of the University of California, Oakland, CA (US)

(72) Inventors: Alexander A. Trusov, Irvine, CA (US); Doruk Senkal, Irvine, CA (US); Andrei M. Shkel, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 119 days.

(21) Appl. No.: 13/838,132

(22) Filed: Mar. 15, 2013

(65) Prior Publication Data

US 2014/0021561 A1     Jan. 23, 2014

Related U.S. Application Data

(60) Provisional application No. 61/674,751, filed on Jul. 23, 2012.

(51) Int. Cl.
*G01P 15/00* (2006.01)
*B81B 3/00* (2006.01)
*B81C 1/00* (2006.01)
*G01C 19/5691* (2012.01)

(52) U.S. Cl.
CPC ........... *B81B 3/0018* (2013.01); *B81C 1/00134* (2013.01); *B81C 1/00634* (2013.01); *G01C 19/5691* (2013.01); *B81B 2201/0271* (2013.01)

(58) Field of Classification Search
USPC ............ 257/415; 438/50; 65/106; 73/504.13
See application file for complete search history.

(56) References Cited

U.S. PATENT DOCUMENTS

| 8,766,745 B1* | 7/2014 | Kubena et al. ................. 333/186 |
| 2010/0207016 A1* | 8/2010 | McBride et al. ............... 250/251 |
| 2011/0290021 A1* | 12/2011 | Horning et al. ............ 73/504.13 |
| 2012/0285198 A1* | 11/2012 | Shang ............................... 65/22 |

\* cited by examiner

*Primary Examiner* — David Vu
*Assistant Examiner* — Brandon Fox
(74) *Attorney, Agent, or Firm* — Marcus C. Dawes; Daniel L. Dawes (57) ABSTRACT

A high temperature micro-glassblowing process and a novel inverted-wineglass architecture that provides self-aligned stem structures. The fabrication process involves the etching of a fused quartz substrate wafer. A TSG or fused quartz device layer is then bonded onto the fused quartz substrate, creating a trapped air pocket or cavity between the substrate and the TSG device layer. The substrate and TSG device layer 14 are then heated at an extremely high temperature of approximately 1700° C., forming an inverted wineglass structure. Finally, the glassblown structure is cut or etched from the substrate to create a three dimensional wineglass resonator micro-device. The inverted wineglass structure may be used as a high performance resonator for use as a key element in precision clock resonators, dynamic MEMS sensors, and MEMS inertial sensors.

15 Claims, 8 Drawing Sheets

MICROFABRICATION OF HIGH QUALITY THREE DIMENSIONAL STRUCTURES USING WAFER-LEVEL GLASSBLOWING OF FUSED QUARTZ AND ULTRA LOW EXPANSION GLASSES

RELATED APPLICATIONS

The present application is related to U.S. Provisional Patent Application Ser. No. 61/674,751, filed on Jul. 23, 2012, which is incorporated herein by reference and to which priority is claimed pursuant to 35 USC 120.

GOVERNMENT RIGHTS

This illustrated embodiment of the invention was made with government support under W31P4Q-11-1-0006, awarded by Defense Advanced Research Projects Agency. The government has certain rights in the illustrated embodiment of the invention.

BACKGROUND

1. Field of the Technology

The disclosure relates to the field of microfabrication, specifically microfabrication of high quality three dimensional structures using wafer-level glassblowing of fused quartz and ultra low expansion glasses.

2. Description of the Prior Art

Conventional high performance gyroscopes and resonators are fabricated in macroscale using precision machining techniques. This results in large devices (approximately one inch diameter or more as opposed to 1 mm diameter), with large power consumption, and high cost. At the same time, conventional microelectromachined (MEMS) devices, while small and low power, are limited to two dimensional architectures and have poor performance.

Perhaps the most widely known form of vibratory rotation sensors employs three hemispherical shells as vibratory elements to detect rotation about three mutually orthogonal axes. Known in commercial avionics as hemispherical resonator gyros (HRG), these devices provide a very high degree of accuracy and sensitivity at low rotation rates as required by inertial grade navigation systems. Other features of HRG include longer useful operating life, higher reliability and a more cost effective system than many alternative rotation sensing technologies for commercial and military aviation.

Also called a hemispherical resonator gyroscope or HRG, a wineglass resonator makes use of a hemisphere driven to resonance, the nodal points of which are measured to detect rotation. There are two basic variants of the system, one based on a rate regime of operation and one based on an integrating regime of operation, usually in combination with a controlled parametric excitation. It is possible to use both regimes with the same hardware, which is a feature unique to this type of gyroscope. Maximization of the quality (Q) factor is key to enhancing performance of vibratory MEMS devices in demanding signal processing, timing and inertial applications. The macro-scale hemispherical resonator gyroscope (HRG) with Q-factors over 25E+6 motivates the investigation of 3-D fused quartz micro-wineglass structures for use as vibratory elements.

With the emergence of novel fabrication techniques, the batch fabrication of 3-D wineglass structures is becoming possible. For instance, hemispherical shells fabricated by deposition of polysilicon or silicon nitride thin films into isotropically etched cavities have recently been demonstrated. Alternative fabrication techniques include "3-D SOULE" process for fabrication of mushroom and concave shaped spherical structures as well as blow molding of bulk metallic glasses into pre-etched cavities. However, MEMS wineglass resonators with sufficient smoothness, low anchor losses and low thermoelastic dissipation (TED) have not yet been demonstrated in the literature. To take full advantage of the 3-D wineglass architecture, fabrication techniques with low surface roughness as well as materials with high isotropy and low thermoelastic dissipation are desired.

It has been demonstrated that MEMS devices can reach the fundamental $Q_{TED}$ limit by using a combination of balanced mechanical design and vacuum packaging with getters. Thermoelastic dissipation is caused by local temperature fluctuations due to vibration and the associated irreversible heat flow, which results in entropic dissipation. Thermoelastic dissipation can be reduced either by decoupling the mechanical vibrations from the thermal fluctuations or by using materials with low coefficient of thermal expansion (CTE). This current illustrated embodiment of the invention focuses on materials with low CTE, such as fused quartz (0.5 ppm/° C.) or ultra low expansion titania silicate glass (0.03 ppm/° C.), which can provide a dramatic increase in fundamental $Q_{TED}$ limit ($Q_{TED}$>7E+10 for a TSG wineglass). However, when compared to silicon, titania silicate glass and fused quartz dry etching suffers from order of magnitude higher surface roughness, lower mask selectivity and aspect ratios.

Pyrex glassblowing at 850° C. on a silicon substrate has been previously demonstrated for fabrication of smooth, symmetric 3-D structures. However, TSG glassblowing requires upwards of 1600° C. glassblowing temperature due to its higher softening point, which prevents the use of fabrication processes that rely on a silicon substrate. The current illustrated embodiment of the invention as detailed below explores the hypothesis that high temperature glassblowing (1650° C.), may serve as an enabling mechanism for wafer-scale fabrication of TSG/fused quartz 3-D wineglass structures.

What is needed therefore is an apparatus and method to bridge the gap between conventional macroscale gyroscopes and previous MEMS devices by enabling high volume and low cost manufacturing of ultra high quality three dimensional MEMS devices using advanced materials, which are not amenable to conventional MEMS fabrication.

BRIEF SUMMARY

The illustrated embodiment of the invention is related to the fields of MEMS fabrication processes for micro-glassblowing of low-expansion and low internal loss materials, MEMS fabrication processes for wineglass and mushroom shaped three dimensional glass-blown MEMS resonators, methods of fabricating in-situ tine structures for the purpose of frequency trimming of glass-blown resonators, means of electrostatic actuation and sensing of fabricated MEMS resonators for resonant applications, and utilization of glass-blown structures as optical and opto-mechanical resonator elements.

The object of the illustrated embodiment of the invention further includes the fabrication of extremely high performance MEMS resonators (high Q-factor, symmetry) for timing (clocks), inertial sensors, and signal processing applications, by combining the advantages of low internal loss materials (TSG, fused quartz) and wineglass architectures.

Relevant aspects of the illustrated embodiments include low thermoelastic dissipation because of low thermal expansion materials, low anchor losses due to the wineglass resonator architecture, for optical applications, high optical quality factors due to low surface roughness and pure transparent material, and in-situ two dimensional tines for frequency trimming and for use as electrode structures for capacitive transduction.

The advantages of the illustrated embodiments include an order of magnitude smaller size over the prior art, hence the opportunity to use the wineglass resonator architecture in handheld or mobile applications, lower power consumption, and significantly lower the cost due to batch fabrication technique What is realized by the illustrated embodiments are ultra high quality three dimensional MEMS structures and high performance resonators for use as a key element in precision clock resonators, dynamic MEMS sensors, and MEMS inertial sensors.

The invention comprises a method for fabricating a wineglass micro-structure for use in a hemispherical resonator gyroscope. The method includes etching at least one cavity into a substrate and then bonding a device layer to the substrate and disposed over the at least one cavity in a stacked configuration. The stacked device layer and substrate is then heated which forms a three dimensional inverted wineglass structure. The inverted wineglass structure is then released from the substrate.

In one embodiment, etching of the at least one cavity into the substrate comprises etching the at least one cavity with reactive-ion etching (RIE).

In another embodiment, bonding a device layer to the substrate and disposed over the at least one cavity in a stacked configuration also includes creating a seamless hermetic seal around the at least one cavity.

In yet another embodiment, heating the stacked device layer and substrate includes heating the substrate stack in a first chamber; and then transferring the substrate stack to a second chamber enveloped by a water cooled jacket, wherein the second chamber is cooler than the first chamber.

In another embodiment, forming a three dimensional inverted wineglass structure includes glassblowing the device layer and creating a self-aligned stem disposed between the at least one cavity.

In yet a further embodiment, releasing the inverted wineglass structure from the substrate is done by performing laser ablation around the perimeter of the inverted wineglass structure.

In still another embodiment, the fabrication process includes etching the device layer around the perimeter of the at least one cavity after bonding the device layer to the substrate. The substrate is then removed from under the device layer leaving the inverted wineglass structure coupled to the substrate by a self-aligning stem created by the heating of the stacked device layer and substrate. The etching of the device layer around the perimeter of the at least one cavity after bonding the device layer to the substrate may be done by etching an interlocking pattern around the perimeter of the at least one cavity.

The invention further includes a wineglass micro-structure glassblown from a substrate, the wineglass micro-structure being for use in a hemispherical resonator gyroscope. The micro-structure contains a device layer capable of being at least temporarily bonded to the substrate over at least two etched cavities while the device layer and substrate are heated, and a self-aligning stem coupled to the substrate formed from heating of the device layer, where the device layer and self-aligning stem form the wineglass micro-structure when separated from the substrate.

In one particular embodiment, the device layer of the wineglass micro-structure is comprised of ultra low expansion titania silicate.

In a related embodiment, the substrate of the wineglass micro-structure is comprised of fused quartz.

In another embodiment, the wineglass micro-structure also includes a plurality of tines disposed around the perimeter around the wineglass micro-structure, the tines provided for frequency trimming and for use as electrode structures for capacitive transduction.

The wineglass micro-structure is fabricated by first bonding the device layer to the substrate and disposed over the at least one cavity in a stacked configuration. The stacked device layer and substrate is then heated, forming a three dimensional inverted wineglass structure. Finally, the inverted wineglass structure is released from the substrate.

In one embodiment, heating of the stacked device layer and substrate includes heating the substrate stack in a first chamber, and then transferring the substrate stack to a second chamber enveloped by a water cooled jacket, wherein the second chamber is cooler than the first chamber.

In another embodiment, the fabrication of the wineglass micro-structure includes etching the device layer around the perimeter of the at least one cavity after bonding the device layer to the substrate.

In another embodiment, the fabrication of the wineglass micro-structure includes removing the substrate from under the device layer decoupling the wineglass micro-structure. In this embodiment, etching of the device layer around the perimeter of the at least one cavity after bonding the device layer to the substrate may be performed by etching an interlocking pattern around the perimeter of the at least one cavity.

The invention further includes a hemispherical resonator gyroscope having a wineglass resonator. The wineglass resonator includes a device layer capable of being at least temporarily bonded to the substrate over at least two etched cavities while the device layer and substrate are heated, and a self-aligning stem coupled to the substrate formed from heating of the device layer, where the device layer and self-aligning stem form the wineglass micro-structure when separated from the substrate.

In one specific embodiment, the wineglass resonator further includes a plurality of tines disposed around the perimeter around the wineglass micro-structure, the tines provided for frequency trimming and for use as electrode structures for capacitive transduction.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The disclosure can be better visualized by turning now to the following drawings wherein like elements are referenced by like numerals.

The disclosure and its various embodiments can now be better understood by turning to the following detailed description of the preferred embodiments which are presented as illustrated examples of the embodiments defined in the claims. It is expressly understood that the embodiments as defined by the claims may be broader than the illustrated embodiments described below.

DETAILED DESCRIPTION OF THE PREFERRED EMBODIMENTS

Figure 1A:
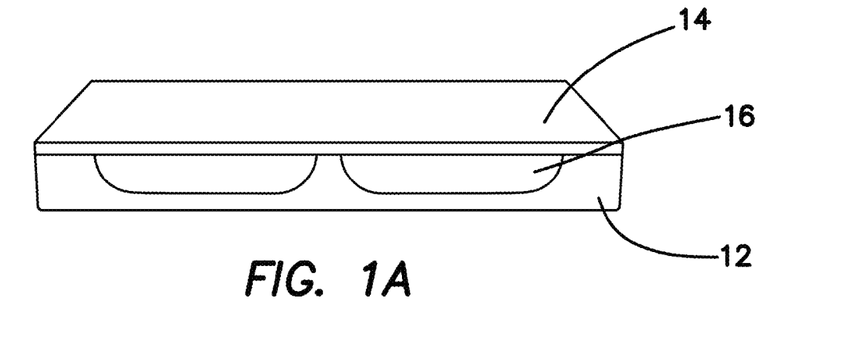
FIG. 1A is a cross sectional view of the stacked device layer and substrate after etching a toroidal cavity into the substrate and then being bonded to the device layer.
Figure 1B:
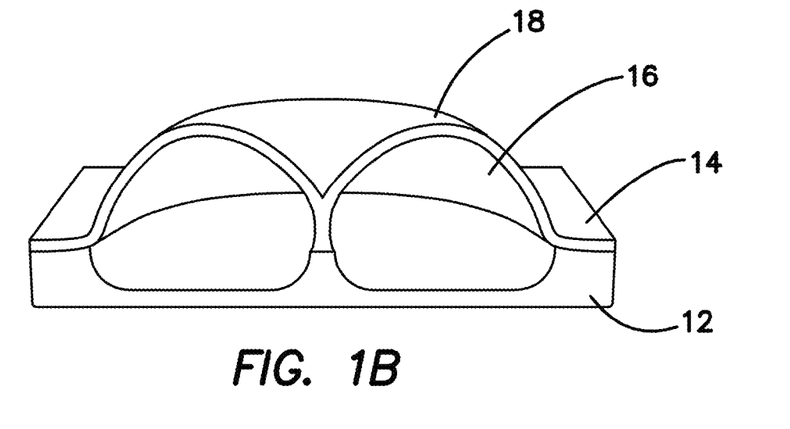
FIG. 1B is a cross sectional view of the configuration seen in FIG. 1A after heat has been applied to the staked device layer and substrate, creating a self-aligned stem.
Figure 1C:
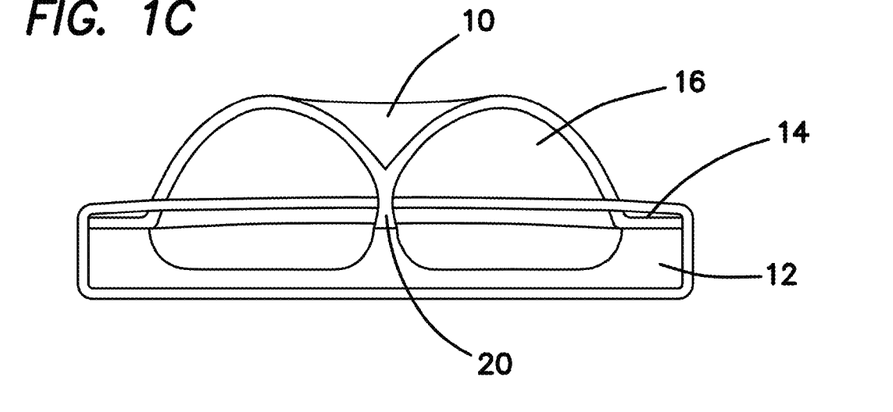
FIG. 1C is a cross sectional view of the configuration seen in FIG. 1B after forming an inverted wineglass structure and releasing it from the substrate along its perimeter.

The approach comprises of a high temperature micro-glassblowing process and a novel inverted-wineglass architecture that provides self-aligned stem structures as seen in FIGS. 1A-1C. An in-house process capability of 1800° C. glassblowing with a rapid cooling rate of 500° C./min was developed. Feasibility of the process has been demonstrated by fabrication of TSG/fused quartz micro-wineglass structures.

The illustrated embodiments of the invention are generally directed to a micro-glassblowing based MEMS process for low expansion and low internal loss materials such as Titania Silicate Glass (TSG) and fused quartz. The illustrated embodiment of the invention further comprises a method for fabrication of three dimensional wineglass structures through glassblowing and method of fabricating tine structures on the glassblown resonators. The invention further includes in additional embodiments the fabrication of electrode structures for excitation and pick-off in MEMS three dimensional wineglass and spherical resonators and optical resonator applications of high quality MEMS glassblown structures.

The illustrated embodiments of the invention are accomplished through a fabrication process seen in FIGS. 1A-1C that involves the etching of a fused quartz substrate wafer 12. A TSG or fused quartz device layer 14 is then bonded onto the fused quartz substrate 12, creating a trapped air pocket or cavity 16 between the substrate 12 and the TSG device layer 14. The substrate 12 and TSG device layer 14 are then heated at an extremely high temperature (~1700° C.), forming an inverted wineglass structure 18. Finally, the glassblown structure 18 is cut or etched from the substrate 12 to create a three dimensional wineglass resonator micro-device. Frequency trimming is done using tine structures coupled to the resonator micro-device. Electrostatic transduction is accomplished through various electrode structures. Optical resonator application is accomplished through the coupling a light source into the shell of the glass structure 18, allowing it to circulate along the perimeter of the device, effectively creating optical resonance.

While the following description repeatedly references the device layer 14 as being comprised titania silicate glass (TSG), other materials or substances such as fused quartz or fused silica may also be used without departing from the original spirit and scope of the invention. Similarly, while the description refers to the substrate 12 being comprises of fused quartz, other substances and materials such as tungsten or graphite may also be used.

Figure 2A:
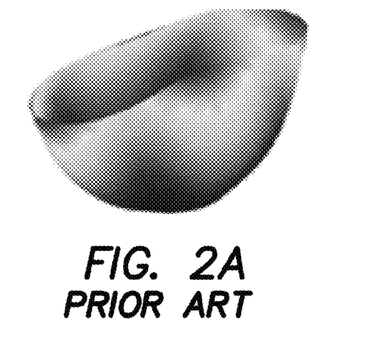
FIG. 2A is a graphical representation of the fundamental $Q_{TED}$ and $Q_{anchor}$ limits without a stem as used in the prior art.
Figure 2B:
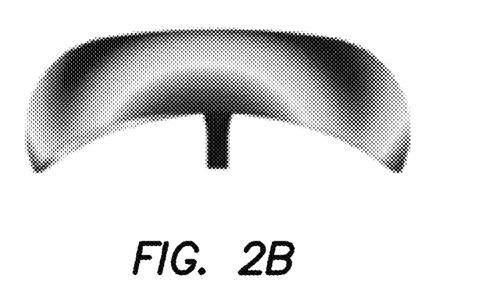
FIG. 2B is a graphical representation of the fundamental $Q_{TED}$ and $Q_{anchor}$ limits with a stem as used in the current illustrated embodiment of the invention.

The inverted wineglass architecture of the current illustrated embodiment of the invention is compared with previously fabricated glassblown structures with large attachment diameter in FIGS. 2A and 2B. The structure in FIG. 2A was fabricated by first glassblowing a spherical structure through a stencil layer and then laser micromachining the cap to create a wineglass structure.

The structure in FIG. 2A has a shell diameter of 1142 μm, anchor diameter of 600 μm, and average thickness of 4 μm, which gives roughly 1:2 attachment to shell diameter ratio. In contrast, the inverted-wineglass structure with the integrated stem of the current illustrated embodiment of the invention seen in FIG. 2B has a shell diameter of 4200 μm, a 300 μm anchor diameter, and an average thickness of 80 μm, giving a 1:14 anchor to shell diameter ratio.

To simulate the acoustic loss in an infinite medium, a perfectly matched layer (PML) was used for the substrate domain. PML works by absorbing acoustic waves over a large frequency range at any non-zero angle of incidence. The simulation was run for perfectly symmetric structures, neglecting the contribution of mass imbalance to the anchor loss. For this reason, the values obtained from FEA represent the fundamental anchor loss limit of the structures. The wineglass structure with 1:2 anchor to shell diameter ratio in FIG. 2A had a fundamental $Q_{anchor}$ limit of 3000, which is in close agreement with the experimentally obtained quality factor of 1256. In contrast, the analysis of the wineglass structure of the current illustrated embodiment of the invention with the integrated stem (1:14 ratio), FIG. 2B showed virtually zero anchor loss ($Q_{anchor}$ anchor less than 5E+10).

The goal of comparing the current wineglass architecture was to understand the effect of the coefficient of thermal expansion on $Q_{TED}$. Four different materials including Silicon, pyrex, fused quartz and TSG were investigated as seen in Table 1 below. Energy loss caused by thermoelastic dissipation was analyzed using a coupled thermo-mechanical model. The model was solved for the n=2 wineglass modes, and $Q_{TED}$ values were extracted from the ratio of the real and imaginary parts of the eigenfrequencies. The difference in $Q_{TED}$ between the two geometries was limited to within one order of magnitude, whereas the material choice had a huge impact on the $Q_{TED}$. TSG (with the lowest CTE among the materials investigated) had the highest fundamental $Q_{TED}$ value at 7E+10, which was followed by fused quartz at QTED more than 2E+7.

TABLE 1

| | $Q_{TED}$ | | | | |
|---|---|---|---|---|---|
| | Silicon | Pyrex | FQ | TSG | $Q_{anchor}$ |
| (a) w/o stem | 1E+05 | 1E+06 | 4E+07 | 1E+10 | 3E+03 |
| (b) with stem | 6E+04 | 7E+06 | 2E+07 | 7E+10 | 5E+10 |

Figure 1D:
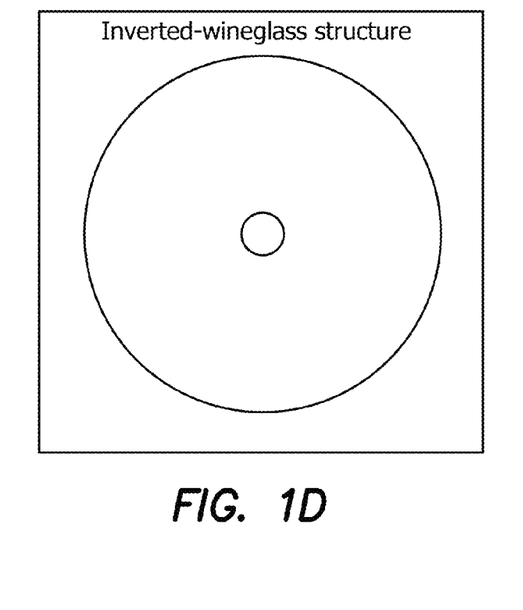
FIG. 1D is a top down view of the substrate after a toroidal shaped cavity has been etched into its surface.

The fabrication process for TSG wineglass structures 10 of the current illustrated embodiment of the invention can be seen in FIGS. 1A-1D. A similar fabrication process for TSG spherical structures 30 in a related embodiment of the invention is seen in FIGS. 12A-12D. The process starts by the low pressure chemical vapor deposition (LPCVD) of a 2 μm PolySi hard mask onto the fused quartz substrate 12. After which, the cavity openings were defined on the PolySi hardmask using reactive-ion etching (RIE). Then, approximately 150 μm deep cavities or pockets 16 were wet etched into the substrate wafer 12 using concentrated HF (49%). In the inverted wineglass structure embodiment, each cavity 16 is substantially toroidal in shape as seen in FIG. 1D, with a central post 22 disposed in the center. In the spherical structure embodiment, each cavity 16 is substantially circular in shape as seen in FIG. 1E. In order to establish the etch rate of HF on fused quartz and TSG, 75 minute test runs were performed at room temperature. Etch depth was measured every fifteen minutes by stopping the etching process and measuring using a DEKTAK 3 profilometer. Linear regression fits showed an etch rate of 1.07 μm/min for fused quartz and 2.86 μm/min for TSG, with a linearity of R2=0.996 and R2=0.997 respectively. Once the etching of the cavities 16 was complete, the PolySi layer was stripped and the wafers were thoroughly cleaned using RCA clean.

Figures 12A, 12B, 12C, 12D:
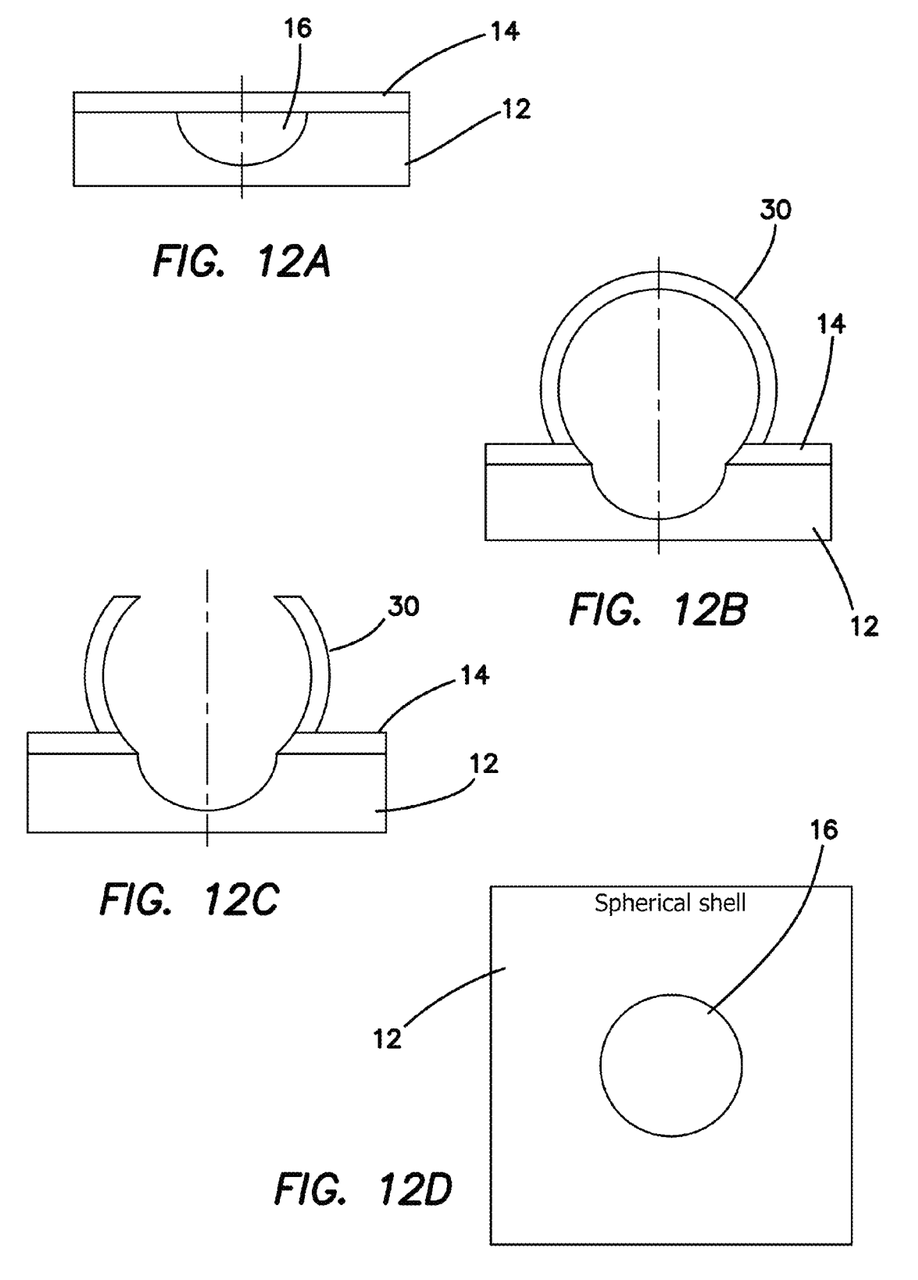
FIG. 12A is a cross sectional view of the stacked device layer and substrate after etching a spherical cavity into the substrate and then being bonded to the device layer.
FIG. 12B is a cross sectional view of the configuration seen in FIG. 1A after heat has been applied to the stacked device layer and substrate.
FIG. 12C is a cross sectional view of the configuration seen in FIG. 1B after forming an three dimensional structure.
FIG. 12D is a top down view of the substrate after a spherical shaped cavity has been etched into its surface.

The next step of the fabrication process seen in FIGS. 1A and 12A is the bonding of the TSG device layer 14 onto the etched fused quartz wafer 12. Due to the subsequent high temperature glassblowing process the bond needs to survive up to 1650° C., which prevents the use of intermediate materials. For this reason, a plasma activated fusion bonding process was developed. The bond between the substrate 12 and the TSG device layer 14 is performed by plasma activating the TSG device layer 14 and the fused quartz substrate 12 and then bringing them into optical contact. Since the process relies on hydrogen bonds to keep the two components together, highly polished and clean surfaces (less than 1 nm Sa) are required. Once cured, the bond creates a seamless hermetic seal around the etched cavities 16 without using any intermediate material.

The TSG device layer 14 and fused quartz substrate 12 stack is then glassblown at 1650° C. as seen in FIGS. 1B and 12B in a custom-built high temperature furnace with a rapid cooling rate of 500° C./min. The furnace consists of two main chambers that are connected to each other through a third vestibule chamber. The first chamber is used for heating and can go up to 1800° C., the second chamber is enveloped by a water cooled jacket, that maintains a temperature of less than 200° C. The samples are transported between the heating and cooling chambers by using a sliding alumina wafer holder. A typical glassblowing run involves keeping the wafer stack at glassblowing temperature for one minute and then extracting the wafer stack into the water cooled jacket for solidification.

Figure 3:
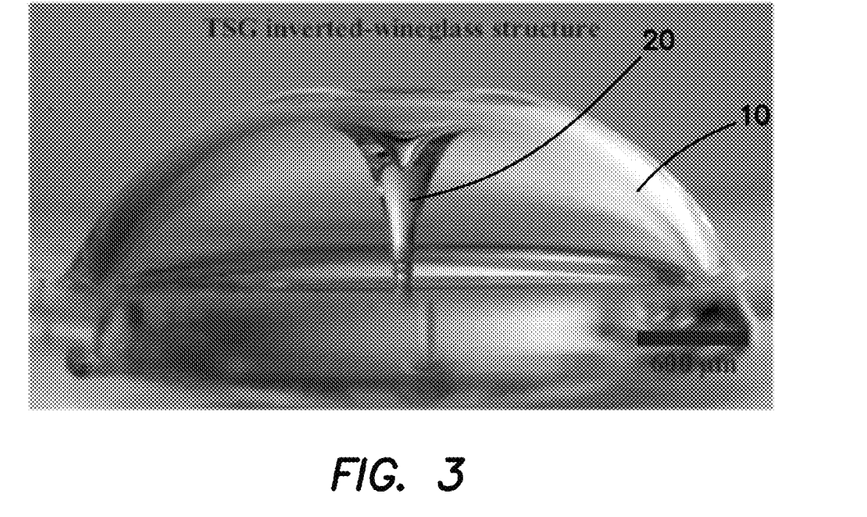
FIG. 3 is an optical photograph of the glassblown inverted wineglass structure of the current illustrated embodiment of the invention.

During glassblowing, two phenomenons occur simultaneously: the TSG device layer 14 becomes viscous due to the elevated temperature, and the air inside the etched cavities 16 expands, creating the 3-D glassblown structure 18. Because the TSG device layer 14 is bonded around the toroidal etched cavity 16, the glassblown structure 18 creates a self-aligned TSG stem 20 from the central post 22 as seen in FIG. 1C and FIG. 3. At the point the TSG stem 20 is formed, the glassblown structure 18 forms into a completed an inverted wineglass structure 10. In the spherical structure embodiment, the circular shaped cavity 16 forms a 3-D glassblown structure that is a substantially spherical structure 30 as seen in FIGS. 12B and 12C.

Figure 4:
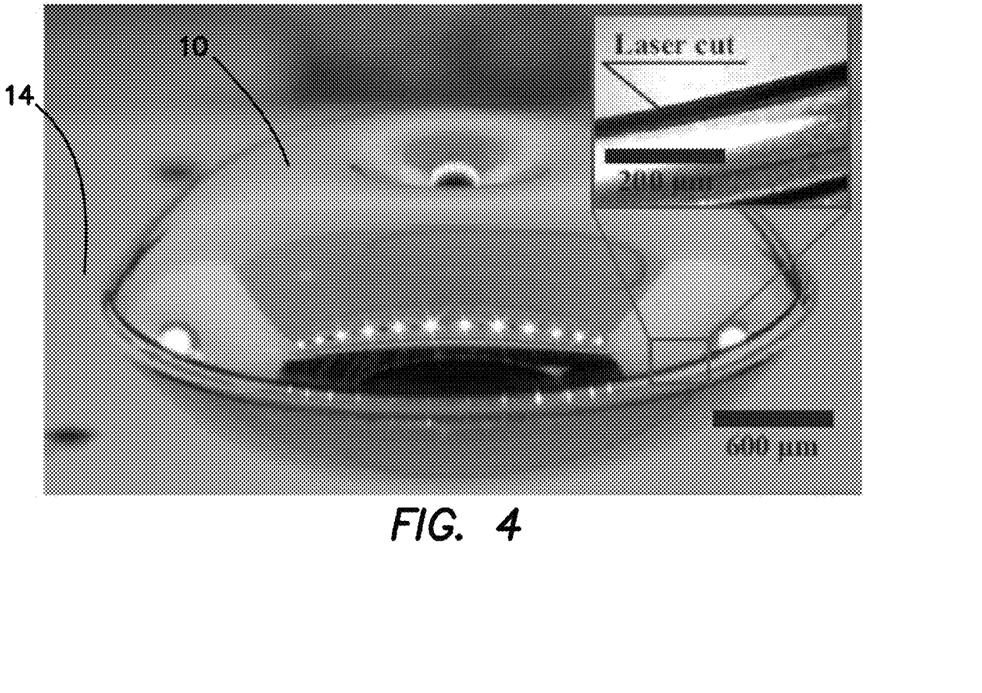
FIG. 4 is an optical photograph of the inverted wineglass structure after being released from the substrate along its perimeter.

The final step of the fabrication process is to release the wineglass structure 10 around its perimeter, which can be accomplished by laser ablation or dry etching of the TSG device layer 14. The wineglass structure 10 as seen in FIG. 4 was released with laser ablation, using a 2-axis laser micromachining system, Resonetics RapidX 250. The system was upgraded to 3-axis by installing a custom built rotary stage assembly from National Aperture, Inc. The wineglass structure 10 was mounted onto the rotary stage and its axis of symmetry was aligned with the rotation axis with the help of an x-y stage. Laser ablation was performed by focusing the laser onto the perimeter of the wineglass structure 10 at a perpendicular angle and rotating the wineglass structure 10 at a constant angular velocity. For the laser source, an ArF (193 nm) excimer laser (Coherent COMPexPRO 110) was used with 20 ns pulse duration, 50 Hz repetition rate and a laser spot size of 40 μm.

Figure 9A:
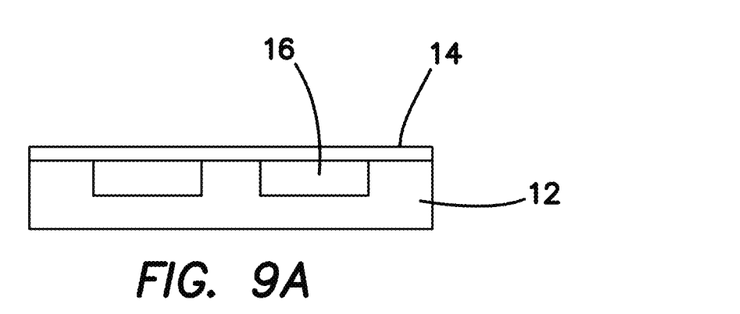
FIG. 9A is the first fabrication step for an alternative embodiment of the current illustrated embodiment of the invention showing the device layer after being bonded to the substrate.
Figure 9B:
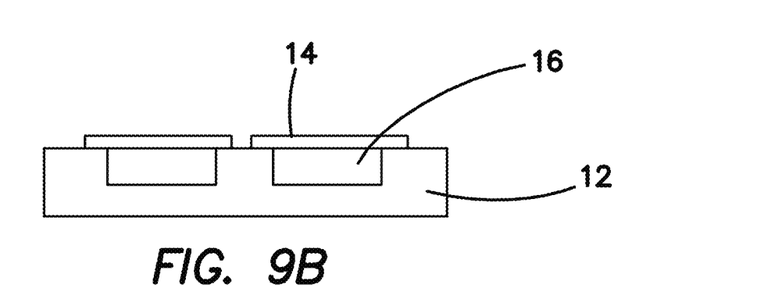
FIG. 9B is the alternative embodiment of the current illustrated embodiment of the invention shown in FIG. 9A after portions of the device layer have been removed from around the perimeter of the cavities.
Figure 9C:
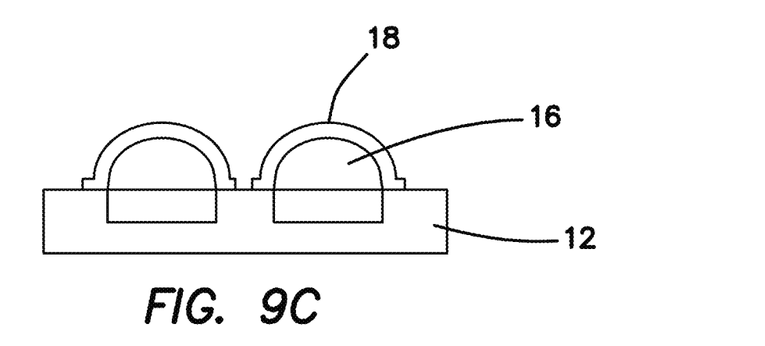
FIG. 9C is the alternative embodiment of the current illustrated embodiment of the invention shown in FIG. 9B after glassblowing.
Figure 9D:
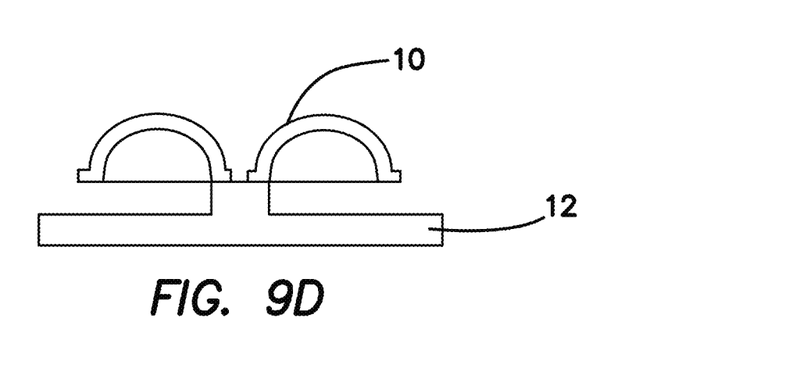
FIG. 9D is the alternative embodiment of the current illustrated embodiment of the invention shown in FIG. 9C after the substrate has been undercut forming self-releasing wineglass structure.

In another embodiment, the wineglass structures 10 are self-releasing. In this embodiment, the cavities 16 are etched into the substrate 12 and then covered with the TSG device layer 14 as before as seen in FIG. 9A. However, after bonding the TSG device layer 14 to the substrate 12, the TSG device layer 14 is etched around the outer perimeter of the cavities 16, leaving only enough of the TSG device layer 14 to hermetically seal the cavities 16 as seen in FIG. 9B. In FIG. 9C, the stacked substrate 12 and TSG device layer 14 undergo the glassblowing process. Finally, in FIG. 9D, the substrate 12 is undercut, leaving the wineglass structure 10 coupled to the substrate 12 by the stem 20. The wineglass structure 10 may then be separated from the substrate 12 by laser ablation or other known means. By etching the TSG device layer 14 around the perimeter of the cavities 16 before performing any glassblowing, no subsequent three dimensional etching around the wineglass structure 10 is required in order to remove it from the substrate 12. This allows the wineglass structure 10 to be efficiently produced on the scale of large batches.

Figure 10:
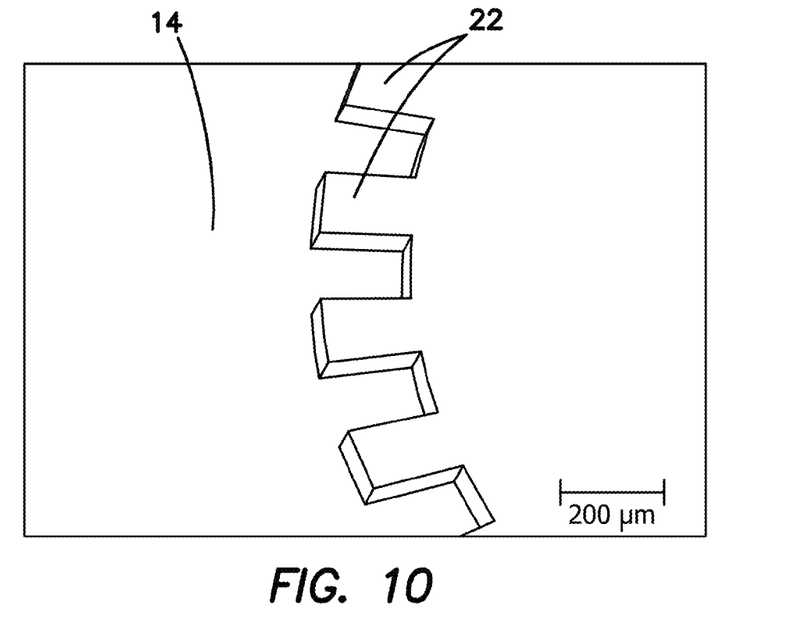
FIG. 10 is a magnified view of the meshed interlocking gear pattern that may be etched between the inverted wineglass structure and the substrate.
Figure 11:
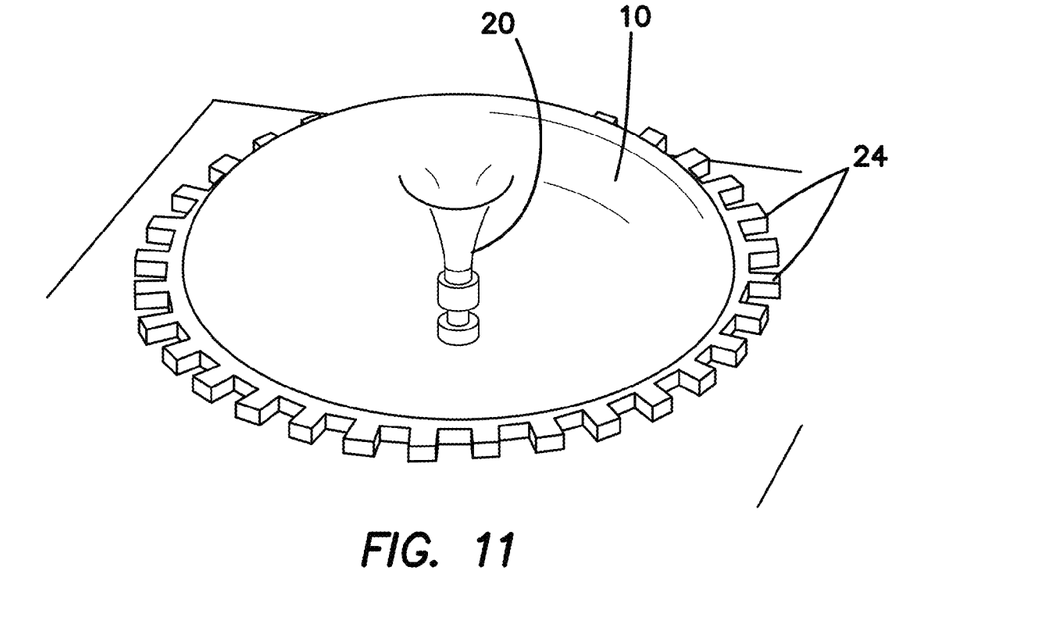
FIG. 11 is a perspective view of the inverted wineglass structure comprising a plurality of tines disposed around the perimeter of the inverted wineglass structure.

In a further embodiment, during the etching of the TSG device layer 14 around of the perimeter of the cavities 16, a substantially interlocking or meshed pattern 22 seen in FIG. 10 may be used. When the wineglass structure 10 is subsequently blown and decoupled from the substrate 12, the wineglass structure 10 will comprise a plurality of tines 24 disposed around its outer circumference as seen in FIG. 11. The presence of tines 24 enable frequency trimming by decoupling mass, stiffness, and Q which allow the wineglass structure 10 to be used in a variety of additional applications such as gyroscopes and the like.

Surface roughness measurements of TSG glassblown samples were performed using an atomic force microscope (AFM) from Pacific Nanotechnology (Nano-R). With a sensor noise level of more than 0.13 nm in the z-direction, Nano-R can resolve sub-nanometer features. Samples were cleaned using standard solvent clean (Acetone, IPA, methanol) before each scan. No additional treatment was performed on the samples. The AFM was run in tapping mode, using a 10 nm radius probe tip (Agilent U3120A).

Figure 5A:
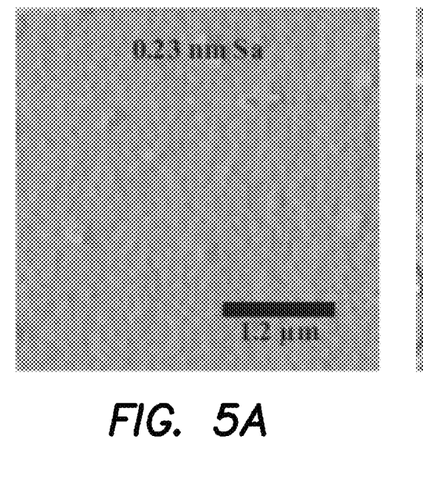
FIG. 5A is a magnified view of the surface of the device layer after glassblowing.
Figure 5B:
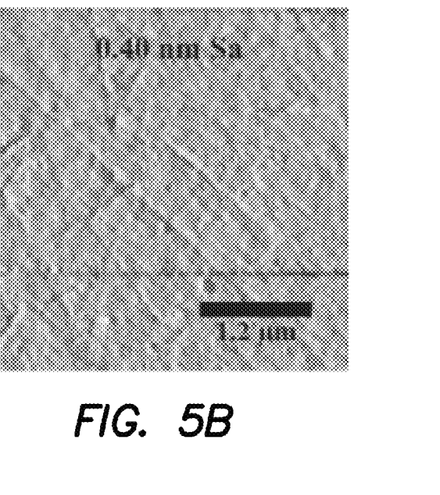
FIG. 5B is a magnified view of the surface of the device layer before glassblowing.

Surface roughness of the TSG device layers 14 before and after glassblowing were analyzed, with the hypothesis that glassblowing can improve the surface roughness. Highly polished TSG device layers 14 were used for the device layer, which was verified by AFM scans, showing a surface roughness of 0.40 nm Sa. Characterization of the glassblown samples showed a two-fold improvement in surface roughness, down to 0.23 nm Sa as seen in FIG. 5A. We also observed that the angstrom level scratches seen in FIG. 5B, associated with the lapping operation, disappeared after glassblowing confirming the hypothesis.

Two-fold improvement in surface roughness is attributed to viscous flow of the TSG device layer 14 and the associated surface tension forces. As the glassblowing is performed above the glass softening temperature, the TSG device layer 14 becomes viscous and the surface tension forces become active, working towards minimizing the surface area of the glass structure. This creates an effect analogous to "stretching out" the wrinkles on the surface, lowering the surface roughness.

For resonant and optical applications, it is critical that TSG retains its original material composition and properties after the glassblowing process, which are structural integrity, material uniformity, and optical transparency. We found that the glassblowing temperature and the rate of cooling are the most important parameters that affect the quality of the TSG device layer 14 after glassblowing.

Figure 6:
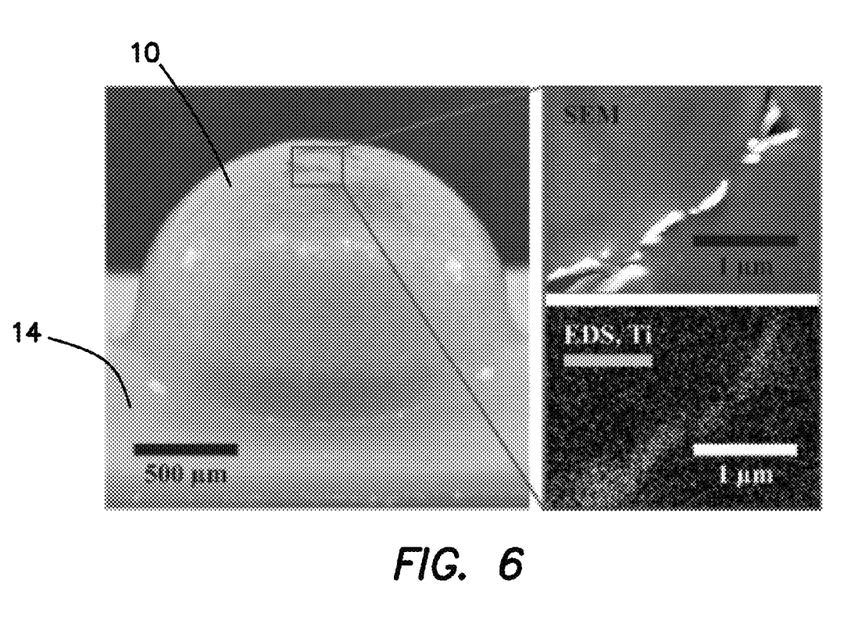
FIG. 6 is a perspective view of the inverted wineglass structure after a slow cooling process which causes re-crystallization.

The structure in FIG. 6 was glassblown using a conventional high temperature furnace at 1600° C., which does not allow removal of the samples at elevated temperatures. For this reason, the structure was left to cool-down to room temperature over an eight hour period. Re-crystallization as well as microcracks were observed on the surface. In order to establish the nature of the re-crystallization, electron dispersive spectroscopy (EDS) was employed. A Philips XL-30 FEG SEM with a Thermo Scientific UltraDry silicon drift X-ray detector was used for EDS characterization. An acceleration voltage of 10 kV was used at 10 mm working distance, and samples were coated with 5 nm of sputtered iridium to prevent charging.

Figure 7:
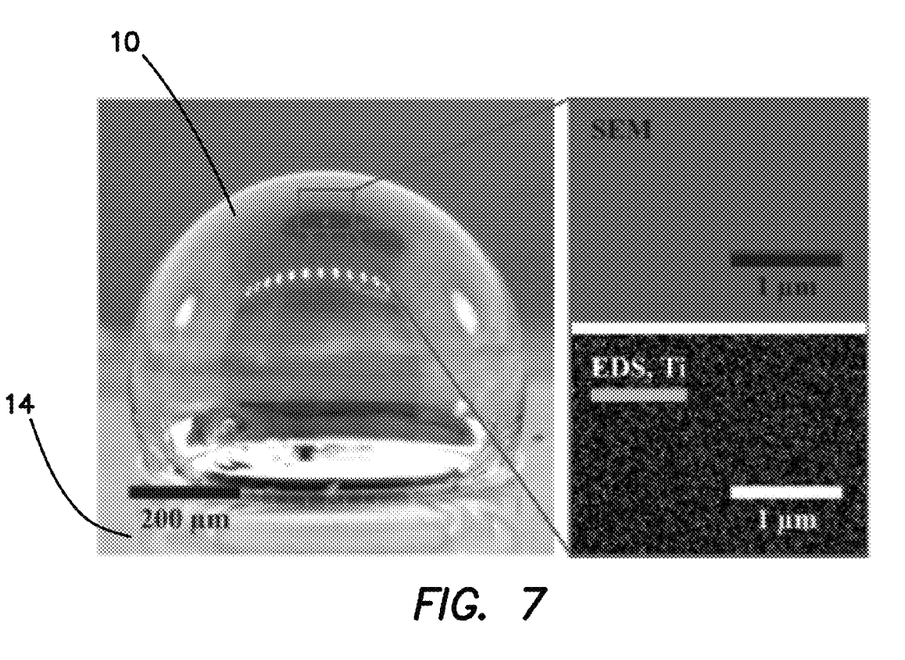
FIG. 7 is a perspective view of the inverted wineglass structure after a rapid cooling process which prevents re-crystallization.

EDS analysis of the crystals in FIG. 6 revealed higher concentrations of titanium, implying that $TiO_2$ is exsolving from the $SiO_2/TiO_2$ matrix. In contrast, the structure in FIG. 7 was glassblown using rapid cooling by bringing the temperature of the sample from 1650° C. to approximately 200° C. within a minute. No microcracks or re-crystallization were observed, as can be validated by the optical transparency. EDS spectral plots showed homogeneous $SiO_2$ and $TiO_2$ distribution in FIG. 7 as opposed to heterogeneous distribution in FIG. 6.

Figure 8:
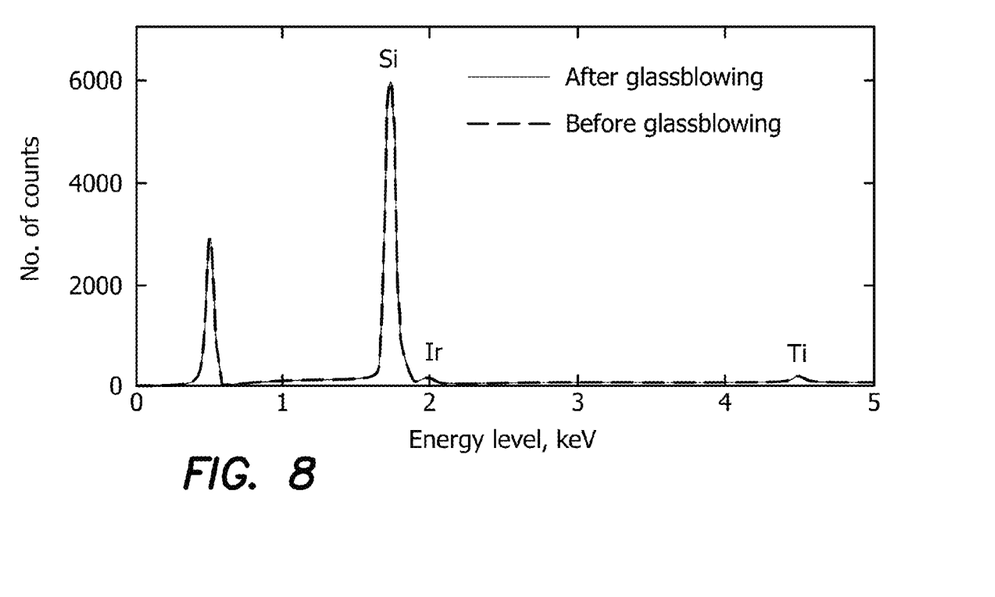
FIG. 8 is a graph of the number of counts versus energy level demonstrating that the composition of TSG does not change after glassblowing.

EDS was used to obtain the spectral signatures of TSG before and after glassblowing. No change in the composition of TSG was observed after glassblowing as seen in FIG. 8. EDS spectrums also revealed 7 to 8 weight percent of $TiO_2$ in TSG, which is in agreement with the nominal $TiO_2$ concentration of Corning ULE TSG.

In summary, the current illustrated embodiment of the invention is a new high temperature micro-glassblowing process for fabrication of 3-D low internal loss ULE TSG wineglass structures 10 was developed and experimentally demonstrated. The process was enabled by the development of an in-house high temperature glassblowing capability of 1800° C. with a cooling rate of less than 500° C./min and plasma activated fusion bonding of TSG to fused quartz. EDS spectral analysis of TSG before and after glassblowing revealed that the material retained its properties after glassblowing with no re-crystallization or change in glass composition. AFM surface scans of the glassblown structures showed extremely low surface roughness (0.23 nm Sa). A novel inverted-wineglass architecture 10 was also implemented, providing self-aligned stem structures with a fundamental anchor loss limit of $Q_{anchor}$ less than 7E+10. The current method may enable new classes of TSG/fused quartz MEMS devices with extremely low surface roughness, intrinsically low internal losses ($Q_{TED}$ less than 5E+10) and dynamically balanced structures.

Many alterations and modifications may be made by those having ordinary skill in the art without departing from the spirit and scope of the embodiments. Therefore, it must be understood that the illustrated embodiment has been set forth only for the purposes of example and that it should not be taken as limiting the embodiments as defined by the following embodiments and its various embodiments.

Therefore, it must be understood that the illustrated embodiment has been set forth only for the purposes of example and that it should not be taken as limiting the embodiments as defined by the following claims. For example, notwithstanding the fact that the elements of a claim are set forth below in a certain combination, it must be expressly understood that the embodiments includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the embodiments is explicitly contemplated as within the scope of the embodiments.

The words used in this specification to describe the various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the embodiments.

We claim:

1. A method for fabricating a three dimensional micro-structure for use in a resonator gyroscope comprising:
   etching at least one cavity into a substrate;
   bonding a planar device layer to the substrate and disposed over the at least one cavity in a stacked configuration
   heating the stacked device layer and substrate;
   forming a the three dimensional micro-structure from the device layer; and
   releasing the three dimensional micro-structure formed from the device layer from the substrate,
   wherein releasing the three dimensional structure from the substrate further comprises lapping the substrate to remove the substrate completely from the three dimensional structure.

2. The method of claim 1 wherein etching at least one cavity into a substrate comprises etching a toroidal cavity with at least one central post structure disposed inside the at least one cavity.

3. The method of claim 1 wherein etching the at least one cavity into a substrate comprises etching at least one cavity with reactive-ion etching (RIE).

4. The method of claim 1 wherein bonding a device layer to the substrate and disposed over the at least one cavity in a stacked configuration further comprises creating a seamless hermetic seal around the at least one cavity.

5. The method of claim 1 wherein forming a three dimensional structure further comprises glassblowing the device layer and creating a self-aligned stem disposed between the at least one cavity to create an inverted wineglass structure.

6. The method of claim 1 further comprising etching the device layer around the perimeter of the at least one cavity after bonding the device layer to the substrate.

7. A method for fabricating a micro-structure for use in a resonator gyroscope comprising:
   etching at least one cavity into a substrate;
   bonding a device layer to the substrate and disposed over the at least one cavity in a stacked configuration;
   heating the stacked device layer and substrate; forming a three dimensional structure; and
   releasing the three dimensional structure from the substrate,
   wherein heating the stacked device layer and substrate comprises:
      heating the substrate stack in a first chamber; and
      transferring the substrate stack to a second chamber enveloped by a water cooled jacket, wherein the second chamber is cooler than the first chamber.

8. A method for fabricating a micro-structure for use in a resonator gyroscope comprising:
   etching at least one cavity into a substrate;
   bonding a device layer to the substrate and disposed over the at least one cavity in a stacked configuration;
   heating the stacked device layer and substrate; forming a three dimensional structure; and
   releasing the three dimensional structure from the substrate,
   wherein releasing the three dimensional structure from the substrate further comprises performing laser ablation around the perimeter of the three dimensional structure.

9. A method for fabricating a micro-structure for use in a resonator gyroscope comprising:
   etching at least one cavity into a substrate;
   bonding a device layer to the substrate and disposed over the at least one cavity in a stacked configuration;
   heating the stacked device layer and substrate; forming a three dimensional structure;
   releasing the three dimensional structure from the substrate, and
   etching the device layer around the perimeter of the at least one cavity after bonding the device layer to the substrate;
   removing the substrate from under the device layer leaving the inverted wineglass structure coupled to the substrate by a self-aligning stem created by the heating of the stacked device layer and substrate.

10. The method of claim 9 wherein etching the device layer around the perimeter of the at least one cavity after bonding the device layer to the substrate comprises etching an interlocking pattern around the perimeter of the at least one cavity.

11. A three dimensional micro-structure glassblown from a substrate, the three dimensional micro-structure for use in a resonator gyroscope comprising:
   a device layer capable of being at least temporarily bonded to the substrate over at least one etched cavity while the device layer and substrate are heated; and
   a self-aligning stem coupled to the substrate formed from heating of the device layer, where the device layer and self-aligning stem form an inverted wineglass microstructure when separated from the substrate,
   a plurality of tines disposed around the perimeter around the three dimensional microstructure, the tines provided for frequency trimming and for use as electrode structures for capacitive transduction.

12. A three dimensional micro-structure glassblown from a substrate, the three dimensional micro-structure for use in a resonator gyroscope comprising:
   a device layer capable of being at least temporarily bonded to the substrate over at least one etched cavity while the device layer and substrate are heated; and a self-aligning stem coupled to the substrate formed from heating of the device layer, where the device layer and self-aligning stem form an inverted wineglass microstructure when separated from the substrate, wherein the three dimensional micro-structure is fabricated by:

bonding the device layer to the substrate and disposed over the at least one cavity in a stacked configuration;

heating the stacked device layer and substrate;

forming a three dimensional structure; and releasing the three dimensional structure from the substrate, wherein heating the stacked device layer and substrate comprises:

heating the substrate stack in a first chamber; and transferring the substrate stack to a second chamber enveloped by a water cooled jacket, wherein the second chamber is cooler than the first chamber.

13. A three dimensional micro-structure glassblown from a substrate, the three dimensional micro-structure for use in a resonator gyroscope comprising:

a device layer capable of being at least temporarily bonded to the substrate over at least one etched cavity while the device layer and substrate are heated; and a self-aligning stem coupled to the substrate formed from heating of the device layer, where the device layer and self-aligning stem form an inverted wineglass microstructure when separated from the substrate, wherein the three dimensional micro-structure is fabricated by:

bonding the device layer to the substrate and disposed over the at least one cavity in a stacked configuration;

heating the stacked device layer and substrate;

forming a three dimensional structure;

releasing the three dimensional structure from the substrate; and removing the substrate from under the device layer leaving the three dimensional micro-structure coupled to the substrate by the self-aligning stem created by the heating of the stacked device layer and substrate.

14. A three dimensional micro-structure glassblown from a substrate, the three dimensional micro-structure for use in a resonator gyroscope comprising:

a device layer capable of being at least temporarily bonded to the substrate over at least one etched cavity while the device layer and substrate are heated; and a self-aligning stem coupled to the substrate formed from heating of the device layer, where the device layer and self-aligning stem form an inverted wineglass microstructure when separated from the substrate, wherein the three dimensional micro-structure is fabricated by:

bonding the device layer to the substrate and disposed over the at least one cavity in a stacked configuration;

heating the stacked device layer and substrate;

forming a three dimensional structure;

releasing the three dimensional structure from the substrate; and etching the device layer around the perimeter of the at least one cavity after bonding the device layer to the substrate.

wherein etching the device layer around the perimeter of the at least one cavity after bonding the device layer to the substrate comprises etching an interlocking pattern around the perimeter of the at least one cavity.

15. A resonator gyroscope having a three dimensional resonator, wherein the three dimensional resonator comprises:

a device layer capable of being at least temporarily bonded to the substrate over at least one etched cavitiy while the device layer and substrate are heated; and a self-aligning stem coupled to the substrate formed from heating of the device layer, where the device layer and self-aligning stem form an inverted wineglass microstructure when separated from the substrate wherein the three dimensional micro-structure further comprises a plurality of tines disposed around the perimeter around the three dimensional micro-structure, the tines provided for frequency trimming and for use as electrode structures for capacitive transduction.

* * * * *